US006535075B2

(12) United States Patent
Frech et al.

(10) Patent No.: US 6,535,075 B2
(45) Date of Patent: Mar. 18, 2003

(54) TUNABLE ON-CHIP CAPACITY

(75) Inventors: Roland Frech, Ostfildern (DE); Erich Klink, Schoenaich (DE); Jochen Supper, Herrenberg (DE)

(73) Assignee: International Business Machines Corporation, Armonk, NY (US)

(*) Notice: Subject to any disclaimer, the term of this patent is extended or adjusted under 35 U.S.C. 154(b) by 91 days.

(21) Appl. No.: 09/737,929

(22) Filed: Dec. 15, 2000

(65) Prior Publication Data

US 2001/0004227 A1 Jun. 21, 2001

(30) Foreign Application Priority Data

Dec. 16, 1999 (EP) .............................. 99125155

(51) Int. Cl.$^7$ ................................ H03H 7/01
(52) U.S. Cl. .................. 333/17.1; 333/181; 333/24 R
(58) Field of Search ................... 333/174, 12, 24 R, 333/17.1, 17.3, 32, 181; 334/52, 55, 83; 307/109; 327/544

(56) References Cited

U.S. PATENT DOCUMENTS 3,475,702 A * 10/1969 Ainsworth ................... 333/17
5,117,206 A * 5/1992 Imamura ..................... 331/158
5,392,456 A * 2/1995 Mitomo et al. ............. 455/38.3
5,726,870 A * 3/1998 Lavieville et al. ........... 363/62
6,333,674 B1 * 12/2001 Dao ........................... 330/86

* cited by examiner

Primary Examiner—Seungsook Ham
(74) Attorney, Agent, or Firm—Lynn L. Augspurger, Esq.; Kevin P. Radigan, Esq.; Heslin, Rothenberg, Farley & Mesiti P.C.

(57) ABSTRACT

The invention relates to a tunable on-chip capacity circuit for a semiconductor chip (10) mounted on a substrate (30) and including a plurality of power supply decoupling capacitors (20–23) which can be selectively activated or deactivated by being switched on or off the power supply system. An on-chip detecting circuit (32) determines a circuit specific load/unload frequency of the on-chip power supply network, and on-chip control means (28, 33) responsive to signals of the detecting circuit increases or decreases the total of the on-chip capacity ($C_{SD}$) by selectively activating or deactivating power supply decoupling capacitors (20–23). Off-chip path impedances ($L_{MC}$, $R_{MC}$), an off-chip capacity ($C_M$) and the total on-chip capacity ($C_C$), including the plurality of power supply decoupling capacitors (20–23) and parasitic on-chip capacities ($C_P$), form a resonance loop (40) which is tunable by changing the total capacity ($C_{SD}$) of the on-chip power supply decoupling capacitors. By tuning the total capacity ($C_{SD}$) of the decoupling capacitors a resonance condition of the resonance loop (40) is met under which a minimum of switching power noise and a minimum switching power consumption is achieved.

14 Claims, 3 Drawing Sheets

TUNABLE ON-CHIP CAPACITY

PRIOR FOREIGN APPLICATIONS

This application claims priority from European patent application Ser. No. 99125155.4, filed Dec. 16, 1999, which is hereby incorporated herein by reference in its entirety.

TECHNICAL FIELD

The invention relates to a tunable on-chip capacity device for a semiconductor chip mounted on a substrate and including a plurality of on-chip power supply decoupling capacitors which are connected to a power supply network. The invention also relates to a method for tuning the capacity of on-chip power supply decoupling capacitors.

BACKGROUND ART

On-chip power supply decoupling capacitors are used to stabilize the on-chip power supply system of synchronously clocked CMOS chips. The highly synchronous on-chip switching activity and its associated high frequency current demand prevents to rely only on off-chip power supply decoupling capacitors. The inductive connection paths between on-chip switching circuitry and off-chip power supply decoupling capacitors do not allow to transfer high amounts of charge in a short time. The initial charge demand of an on-chip switching event has to be served first from on-chip power supply decoupling capacitors. Recharging of the on-chip decoupling capacitors from off-chip capacities happens afterwards with lower speed.

WO96/33495 discloses on-chip power supply decoupling capacitors which are directly connected to the on-chip power distribution network. The capacitors may be implemented by CMOS devices. The known circuit includes a self-repairing capability by using a cross-coupled structure which reacts to a leakage current in one of the transistors to switch into another state. Such circuit facilitates the testability of the whole chip by reducing keeping leakage currents initiated by coupling capacitors. The known on-chip power supply decoupling capacitors have fixed capacity values according to the design specifications. A late adaptation of the capacity values according to the measured chip, module or card conditions is thus prevented.

SUMMARY OF THE INVENTION

It is an object of the invention to propose an on-chip power supply decoupling capacitor arrangement for semiconductor chips which allows a reduction of the on-chip power supply voltage noise and a reduced switching power.

It is also an object of the invention to provide an integrated semiconductor chip mounted on a substrate with a tunable capacity of a plurality of on-chip power supply decoupling capacitors distributed on the chip area.

It is a further object of the invention to provide a method for tuning the capacity of a plurality of on-chip power supply decoupling capacitors according to circuit specific frequency conditions of the power supply during chip switching.

The circuitry according to the invention, as defined in the claims, comprises a set of on-chip power supply decoupling capacitors which can be selectively activated or deactivated by being switched on or off the power supply system. The on-chip capacitors are part of the packaging intrinsic power resonance loop which comprises a fixed on-module decoupling capacity, the total active on-chip capacity including parasitic on-chip capacities, and a parasitic path impedance between both. The power resonance loop is tuned according to the synchronous reaction with the periodic power supply current demand of the chip. Resonance loop tuning is accomplished by changing the capacity of the on-chip power supply decoupling capacitors by activating or deactivating more or less of the on-chip power supply decoupling capacitors. The tuning operation provides a minimum of simultaneous switching noise and a minimum operation power consumption.

According to another aspect of the invention the on-chip power supply decoupling capacitors which are selectively activated or deactivated have different capacities and the selection for activating or deactivating the capacitors may take place in an order of increasing capacity by deactivating one of a plurality of on-chip power supply decoupling capacitors and instead activating another one of that plurality.

Furthermore, according to the invention a method is provided, as defined in the claims, for tuning the capacity of on-chip power supply decoupling capacitors on a semiconductor chip mounted on a substrate by identifying oscillations of a resonance loop which includes said off-chip path impedance, an off-chip capacity and the total on-chip capacity as provided by the plurality of on-chip power supply decoupling capacitors and said parasitic on-chip capacities, and by tuning said resonance loop through changing the total capacity of said power supply decoupling capacitors.

The invention permits an adaptation of the capacity of on-chip power supply decoupling capacitors which results in a reduction of the on-chip power supply voltage noise and the required chip switching power and thus provides an improved product quality level.

BRIEF DESCRIPTION OF THE DRAWINGS

In the following an implementation of the invention is described with reference to drawings which show.

BEST MODE FOR CARRYING OUT THE INVENTION

The circuitry according to the invention comprises a set of on-chip power supply decoupling capacitors $C_1$ distributed over the chip area. Each of the on-chip power supply decoupling capacitors $C_1$ can be individually switched on or off the power supply system. The set of on-chip capacitors is part of a packaging intrinsic power resonance loop which consists of a fixed on-module decoupling capacity $C_M$, the total of the active on-chip capacity $C_C$ and a parasitic path impedance of $L_{MC}$ and $R_{MC}$ between both. The module power resonance loop is reacting synchronously with the periodic power supply current demand of the chip and may be tuned for minimizing the simultaneous switching noise and the chip switching power consumption. Resonance loop tuning is accomplished by activating or deactivating capacitors $C_i$ within the set of on-chip power supply decoupling capacitors $C_i$.

Figure 1:
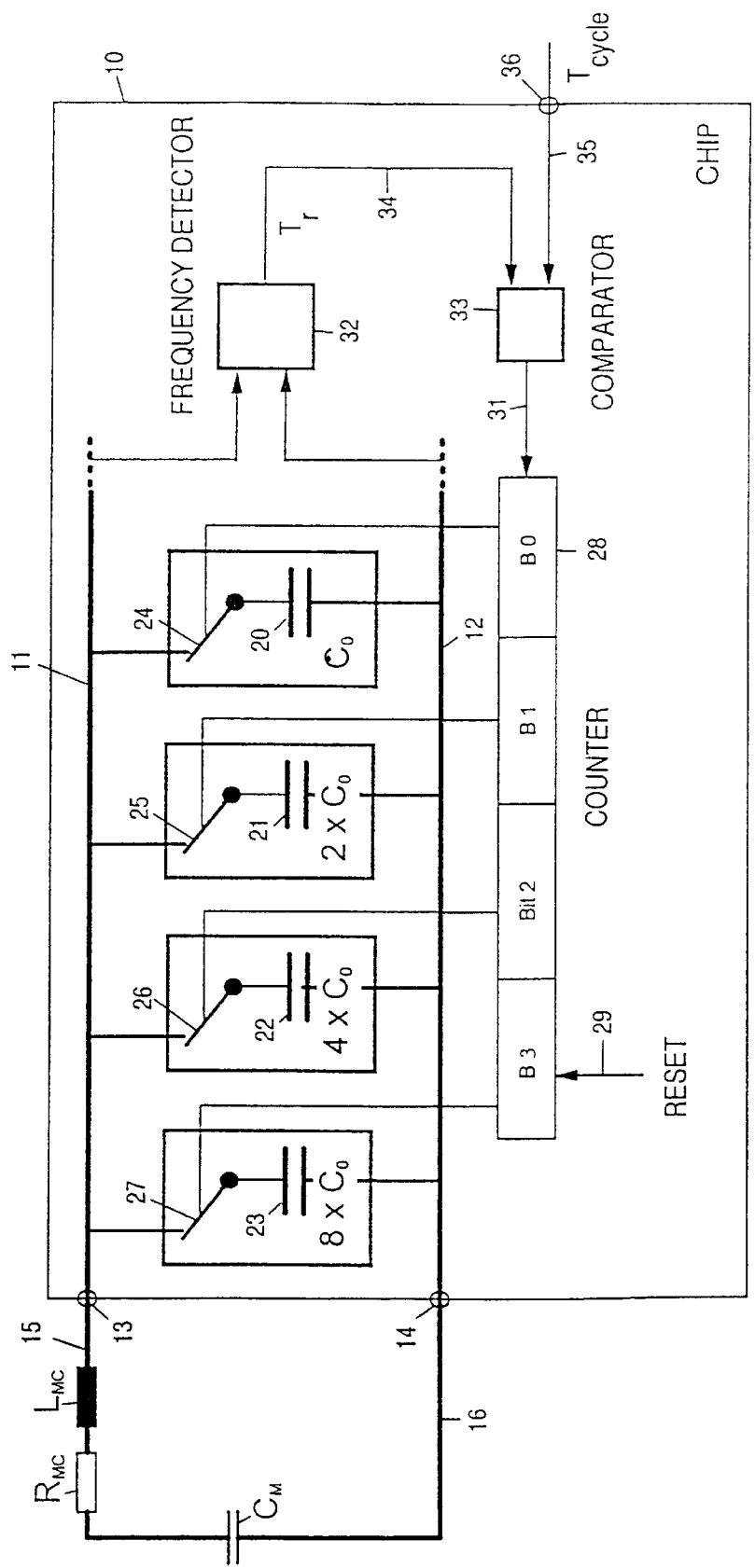
FIG. 1 a schematic circuit diagram of an embodiment of the invention.

FIG. 1 shows an on-chip power supply decoupling capacitor circuit which comprises a semiconductor chip 10 which is mounted on a substrate 30 to form a module. The chip 10 contains power supply lines 11 and 12 which are part of the on-chip power supply network. The lines 11 and 12 are connected through terminals 13 and 14 of chip 10 to off-chip lines 15, 16 which themselves are connected to an off-module power supply system not shown. On-chip power supply decoupling capacitors 20, 21, 22, 23 are with one of their terminals fixedly connected to the power supply line 12. The other terminal of each of the capacitors 20, 21, 22, 23 is connected through a switch 24, 25, 26, 27 to the power supply line 11. The switches 24, 25, 26, 27 are controlled by the stages B0, B1, B2, B3 of an on-chip four bit binary counter 28 for selectively activating or deactivating the capacitors 20, 21, 22, 23 by connecting one or more or all of these capacitors to line 11 or disconnecting one or more of these capacitors from line 11.

The capacitors 20, 21, 22, 23 have different capacity values. Capacitor 20 has the capacity value $C_O$, capacitor 21 has the capacity value $2 \times C_O$, capacitor 22 has the capacity value $4 \times C_O$, and capacitor 23 has the capacity value $8 \times C_O$. For example, if capacitor 20 is deactivated by opening switch 24, the total capacity of the on-chip power supply decoupling capacitors $C_i$ is decreased by the capacity $C_O$ while deactivating capacitor 23 by opening switch 27 decreases the total capacity of the on-chip power supply decoupling capacitors $C_i$ by $8 \times C_O$.

The four capacitors 20, 21, 22, 23 represent only an example to describe the invention. In practice there my be used a larger plurality of on-chip power supply decoupling capacitors $C_i$ and the counter 28 may have a corresponding number of stages $B_i$ to control the capacitors $C_i$.

The binary counter 28 is reset by a signal on line 29 to an initial count value which may be 1111 as shown in FIG. 1 where all capacitors 20, 21, 22, 23 are in their activated position. An on-chip control circuitry generates decrement signals on a line 31 which reduces the count value of the counter 28 by a selected number of decrement steps. This control circuitry comprises a frequency detector 32 and a comparator 33. The frequency detector 32 is responsive to the frequency of its AC input signal and generates a binary value which represents the period $T_r$ of the input frequency $f_r$. Such frequency detector circuits are well known in the art. The input of the frequency detector 32 is connected to power supply lines 11 and 12 to determine the frequency of the power supply current A (FIG. 4/5) on lines 11, 12 during the switching activity of the semiconductor chip. The frequency detector 32 generates at its output 34 a signal which is representative for the period $T_r$ of the frequency of the capacity $C_C$ load/unload current. The comparator 33 compares the signal $T_r$ with a signal on a line 35 which is connected via a terminal 36 with the system clock of the computer system wherein the chip 10 is used. The signal on line 35 represents the cycle time $T_{cycle}$ of the system cycle frequency $f_{cycle}$. The comparator 33 generates decrement signals on line 31 if its input signals are unequal where a constant value is implied in this comparison as described below.

Figure 2:
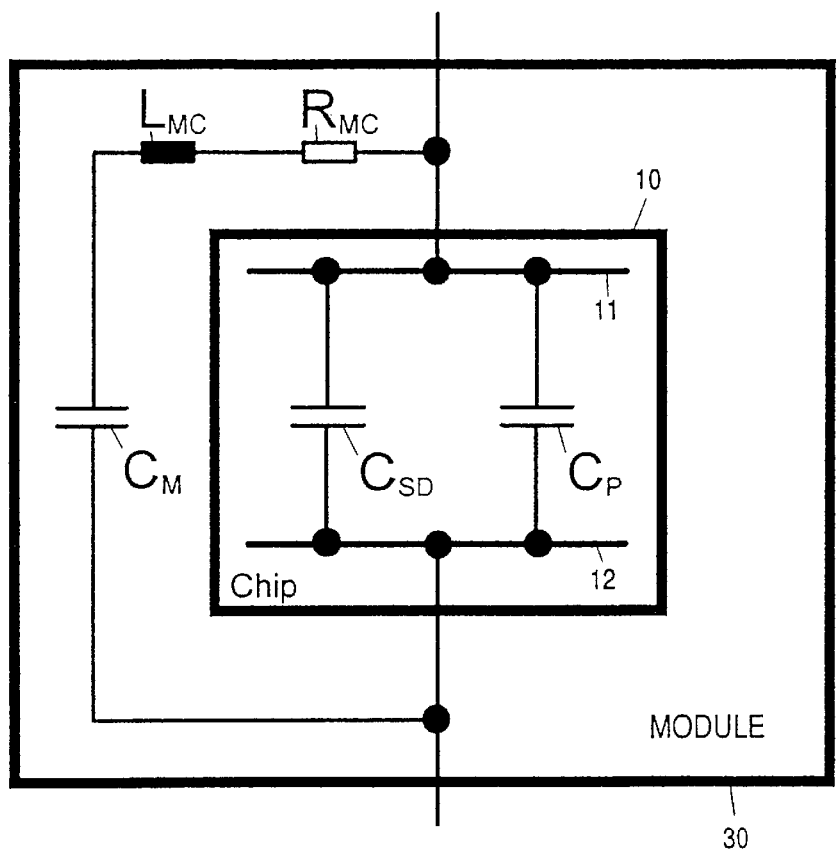
FIG. 2 a schematic model circuit diagram of capacities and impedances effective in the circuit of FIG. 1.

The frequency of the load/unload current on power supply lines 11, 12 is determined by the total chip capacity $C_C$, the on-module decoupling capacity $C_M$ and the parasitic path impedance of $L_{MC}$ and $R_{MC}$ on the module. This is shown in the schematic model circuit diagram of FIG. 2 where the total chip capacity $C_c$ is the sum of all parasitic on-chip capacities $C_P$ and the total capacity $C_{SD}$ of all active (switched on) power supply decoupling capacitors $C_i$ resulting of $C_{SD} = \Sigma C_{i,active}$.

Figure 3:
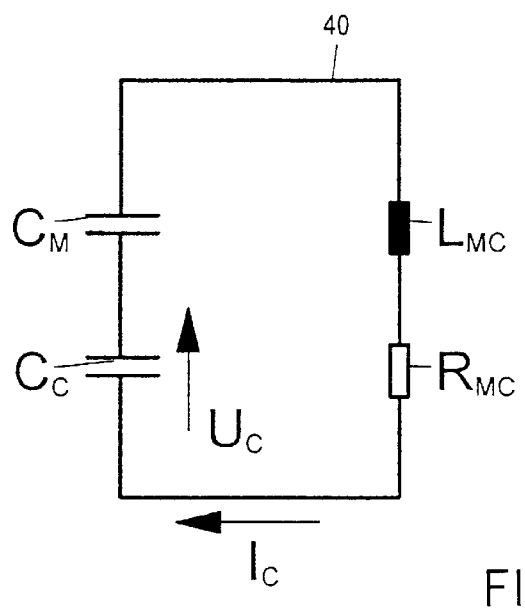
FIG. 3 a schematic model circuit diagram of a resonance loop included in the model circuit of FIG. 2.

As schematically shown in FIG. 3, the total chip capacity $C_C$, the on-module capacity $C_M$ and the parasitic path impedance of $L_{MC}$ and $R_{MC}$ on the module 30 form a packaging intrinsic power supply resonance loop 40 for the on-chip power supply voltage $U_C$ and the power supply load-unload current $I_C$. Capacity $C_M$ is a fixed on-module decoupling capacity $C_M$ and the parasitic path impedance of $L_{MC}$ and $R_{MC}$ are constants which result from the arrangement and length of the power supply lines on the module 30.

The resonance frequency $f_r = 1/T_r$ of the module power supply resonance loop 40 is determined by (neglecting the resistive path contribution):

$$f_r = \frac{1}{2 * \pi * \sqrt{(L_{MC} * C_C)}}$$

$$T_r = 2 * \pi * \sqrt{(L_{MC} * C_C)}$$

wherein $C_C = C_P + C_{SD}$ and $C_M >> C_C$.

To achieve minimum switching power noise and minimum switching power consumption, the power supply resonance loop 40 is tuned to adapt $T_r$ to meet the criterion:

$$T_{cycle} = (k + \frac{1}{4}) * T_r$$

wherein $T_{cycle}$ is the system cycle time and k is an integer constant with k=0, 1, 2, . . . .

The tuning of the power supply resonance loop 40 is performed during the system initialization by adapting the on-chip power supply decoupling capacity by the proper amount of active $C_i$ through switching on a corresponding number of capacitors $C_i$. For this purpose, a cycle time or period $T_r$ of the initial load/unload current frequency is detected by the frequency detector 32 and the detected period $T_r$ is indicated to the comparator 33 which compares $T_r$ with the system cycle time $T_{cycle}$ with implying the predetermined constant k. If the comparison shows an unequal condition, the result of the comparison is used as decrement signal on line 31 for decrementing the counter 28. Thereby the total amount of the power supply decoupling capacity is reduced step by step by switching different ones or more or less of the capacitors $C_i$ in their activated or deactivated status. This operation results in an increasing load/unload current frequency having a shorter period $T_r$ which than is again compared with the system cycle time $T_{cycle}$ to send further decrement signals to the counter 28 if the comparator 33 still indicates an unequal condition. These adaptation steps are iterated until the frequency detector 32 produces a period $T_r$ which is equal to the $T_{cycle}$. In this status the resonance loop 40 is successfully tuned to a condition where power supply network of chip 10 and module 30 shows a minimum switching power noise and the chip 10 requires a minimum switching power consumption.

Figure 4:
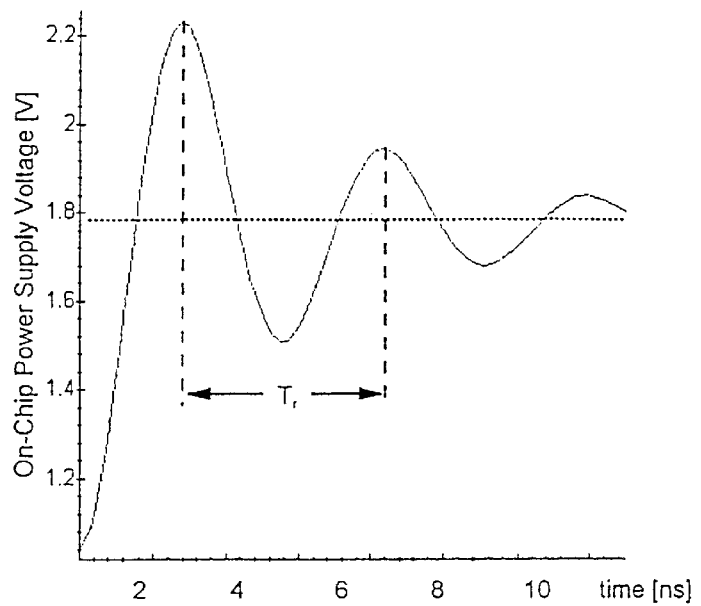
FIG. 4 an example pulse diagram of the calculated power supply voltage over the time for a typical switching activity of a semiconductor chip.
Figure 5:
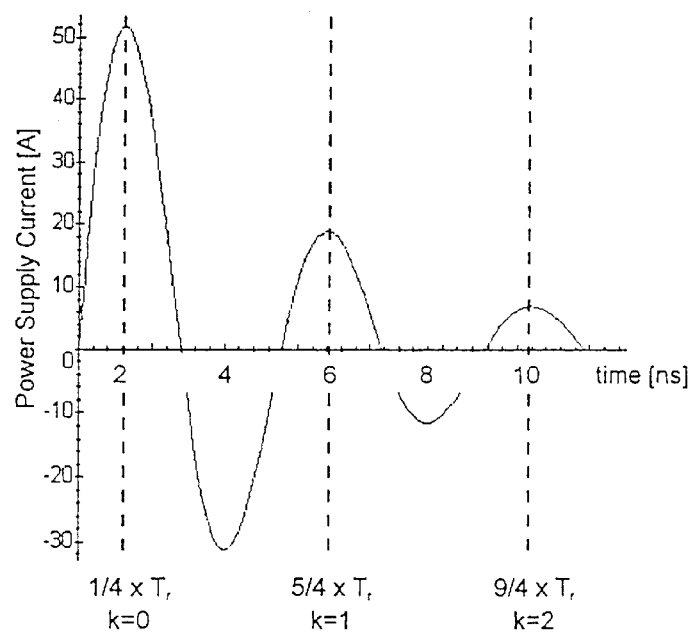
FIG. 5 an example pulse diagram of the calculated on-chip power supply current over the time to show the tuning effect according to the invention.

FIGS. 4 and 5 show calculated frequency curves of the power supply voltage and the power supply current of a predetermined chip switching activity during the initialization phase of the computer system wherein chip 10 and the circuit of FIG. 1 are used. These frequency curves are circuit characteristical of the on-chip power supply network used and represent the synchronous reaction with the periodic power supply current demand of the chip. From FIG. 4 it can be seen that the power supply voltage performs a damped oscillation having a period $T_r$. Accordingly, FIG. 5 shows the corresponding oscillations for the power supply current. The resonance maxima values of the current oscillations may be defined by the constant values k=0, k=1, k=2, where k=0 corresponds to $\frac{1}{4} \times T_r$, k=1 corresponds to $\frac{5}{4} \times T_r$, k=2 corresponds to $9/4 \times T_r$, etc. Which one of the constant values is selected as tuning factor depends on the system clock cycle frequency of the system wherein the circuit of FIG. 1 is used. The selected tuning factor will be (statically) implemented in the comparator 33 and takes part in the comparison performed by the comparator 33. Thus, by using the constant k=1 the circuit of FIG. 1 may be tuned by adapting the capacity $C_{SD}$ in the described manner to the resonance frequency of $5/4 \times T_r$. By such tuning it is achieved that under the existing system parameters the power supply network of chip 10 and module 30 have a minimum switching power noise, and the chip 10 shows a minimum of switching current consumption during the subsequent operations of the computer system.

While the invention is described with reference to a preferred embodiment of the invention, modifications of this embodiment or other implementations of the invention are within the scope of the invention as defined in the claims.

What is claimed is:

1. A tunable on-chip capacity circuit for a semiconductor chip mounted on a substrate and including a plurality of power supply decoupling capacitors ($C_i$) which are connected to a power supply network including a first power line having a first voltage level and a second power line having a second voltage level, and containing parasitic on-chip capacities ($C_P$) and off-chip path impedance comprising inductance ($L_{MC}$) and resistance ($R_{MC}$) and an off-chip capacity ($C_M$) generating power supply voltage noise during a highly synchronous on-chip switching activity, the device comprising:
    a plurality of on-chip switching means each assigned to one of the power supply decoupling capacitors for activating the capacitor by connecting it to one of the power supply lines in a first switching position and for deactivating the capacitor by disconnecting it from the power supply line in a second switching position;
    on-chip means connected to said first and second power supply lines for detecting a circuit specific load/unload frequency of the on-chip power supply network; and
    on chip control means responsive to said detecting for increasing or decreasing the total on-chip capacity ($C_{SD}$) of the power supply decoupling capacitors by selectively operating said switching means.

2. A device according to claim 1, wherein the off-chip path impedance comprising inductance ($L_{MC}$) and resistance ($R_{MC}$), an off-chip capacity ($C_M$) and the total on-chip capacity ($C_C$), including said plurality of power supply decoupling capacitors and said parasitic on-chip capacities ($C_P$), form a resonance loop which is tunable by changing the total capacity ($C_{SD}$) of said power supply decoupling capacitors.

3. A device according to claim 2, comprising means for tuning the total capacity ($C_{SD}$) of the decoupling capacitors to meet a resonance condition by adapting the total on-chip capacity through selectively activating or deactivating on-chip power supply decoupling capacitors.

4. A device according to claim 1, wherein said on-chip control means are responsive to the cycle time $T_{cycle}$ of the system cycle frequency $f_{cycle}$ and comprising means for modifying the total of the on-chip capacity ($C_C$) by comparing period $T_r$ of said load/unload current frequency with the cycle time $T_{cycle}$ of the system cycle frequency to meet the criterion $$T_{cycle}=(k+1/4)*T_r$$

wherein k is an integer constant with k=0, 1, 2, . . . .

5. A device according to claim 1, wherein the on-chip control means comprises means for sequentially activating an increasing number of on-chip power supply decoupling capacitors or sequentially deactivating an increasing number of on-chip power supply decoupling capacitors.

6. A device according to claim 1, wherein said on-chip power supply decoupling capacitors have different capacity values, and said control means comprising means (B0, B1, B2, B3) for selectively activating on-chip power supply decoupling capacitors of different capacity values.

7. A device according to claim 6, wherein the capacity values of said on-chip power supply decoupling capacitors are distinguished from each other by the binary factor 2, 4, 8 etc., and said control means comprising means (B0, B1, B2, B3) for sequentially activating power supply decoupling capacitors having capacity values of increasing or decreasing binary factors.

8. A method for tuning the on-chip capacity of a semiconductor chip mounted on a substrate and including a plurality of power supply decoupling capacitors ($C_i$) which are connected to a power supply network including a first power line having a first voltage level and a second power line having a second voltage level, and containing parasitic on-chip capacities ($C_P$) and an off-chip path impedance comprising inductance ($L_{MC}$) and resistance ($R_{MC}$) and an off-chip capacity ($C_M$) generating a power supply voltage noise during a highly synchronous on-chip switching activity, the method comprising:
    (a) detecting a circuit specific load/unload frequency of the on-chip power supply network; and
    (b) modifying the on-chip capacity in response to the detected frequency by activating or deactivating additional ones or less of said plurality power supply decoupling capacitors to reduce the on-chip power supply voltage noise and the chip switching power consumption.

9. A method according to claim 8, comprising:
    (c) identifying oscillations of a resonance loop which includes said off-chip path impedances, an off-chip capacity ($C_M$) and the total on-chip capacity provided by said plurality of on-chip power supply decoupling capacitors ($C_i$) and said parasitic on-chip capacities ($C_P$); and
    (d) tuning said resonance loop by changing the total capacity of said power supply decoupling capacitors.

10. A method according to claim 9, wherein said tuning (d) meets a resonance condition by reducing or increasing the number of active decoupling capacitors.

11. A method according to claim 9, wherein the identifying (c) comprises (e) determining the cycle time $T_r$ of the circuit specific load/unload frequency $f_r$; and wherein the tuning (d) comprises (f) comparing period $T_r$ of said load/unload frequency with the system clock cycle time $T_{cycle}$ to meet the criterion $$T_{cycle}=(k+1/4)*T_r$$

wherein k is an integer constant with k=0, 1, 2, . . . .

12. A method according to claim 8, wherein (b) comprises sequentially activating an increasing number of on-chip power supply decoupling capacitors or sequentially deactivating an increasing number of on-chip power supply decoupling capacitors.

13. A method according to claim 12, wherein said on-chip power supply decoupling capacitors have different capacity values, and wherein (b) comprises selectively activating or deactivating on-chip power supply decoupling capacitors of different capacity values.

14. A method according to claim 13, wherein the capacity values of said on-chip power supply decoupling capacitors are distinguished from each other by the binary factor 2, 4, 8 etc., and wherein (b) comprises sequentially activating or deactivating power supply decoupling capacitors having capacity values of increasing binary factors.

* * * * *